(12) United States Patent
Eby

(10) Patent No.: US 6,816,992 B2
(45) Date of Patent: Nov. 9, 2004

(54) TEST GENERATOR HAVING A POISSON DISTRIBUTION ERROR SIGNAL

(75) Inventor: David H. Eby, Woburn, MA (US)

(73) Assignee: Tektronix, Inc., Beaverton, OR (US)

( * ) Notice: Subject to any disclaimer, the term of this patent is extended or adjusted under 35 U.S.C. 154(b) by 626 days.

(21) Appl. No.: 09/796,342

(22) Filed: Feb. 28, 2001

(65) Prior Publication Data

US 2002/0120897 A1 Aug. 29, 2002

(51) Int. Cl.[7] .......................... G01R 31/28; G06F 11/00
(52) U.S. Cl. ...................... 714/739; 708/252
(58) Field of Search ................... 714/733–739, 714/814; 708/252–255, 277; 702/179; 370/335, 465, 342

(56) References Cited

U.S. PATENT DOCUMENTS 4,897,842 A * 1/1990 Herz et al. ................. 714/732
5,369,648 A * 11/1994 Nelson ....................... 714/739
5,485,471 A * 1/1996 Bershteyn ................... 714/739

* cited by examiner

Primary Examiner—Guy J. Lamarre
(74) Attorney, Agent, or Firm—Francis I. Gray

(57) ABSTRACT

A test set used for introducing a Poisson distribution of errors into a known digital data signal to produce a test signal uses an error signal generator that produces a Poisson distribution error signal. The error signal is then combined with the known digital data signal to produce a test signal with the Poisson distribution of errors. A pseudo-random binary sequence generator is used to produce a PRBS sequence and a comparator is used for comparing the PRBS sequence with a probability control signal. The comparator sets a single bit in the output stream of zeros when the PRBS sequence is less than the probability control signal. For multiple bit Poisson distribution error signals the PRBS generator and comparator combination may be replicated m times, or a single PRBS generator may be used and a unique independent subset of the PRBS sequence is applied to each of the multiple comparators.

22 Claims, 1 Drawing Sheet

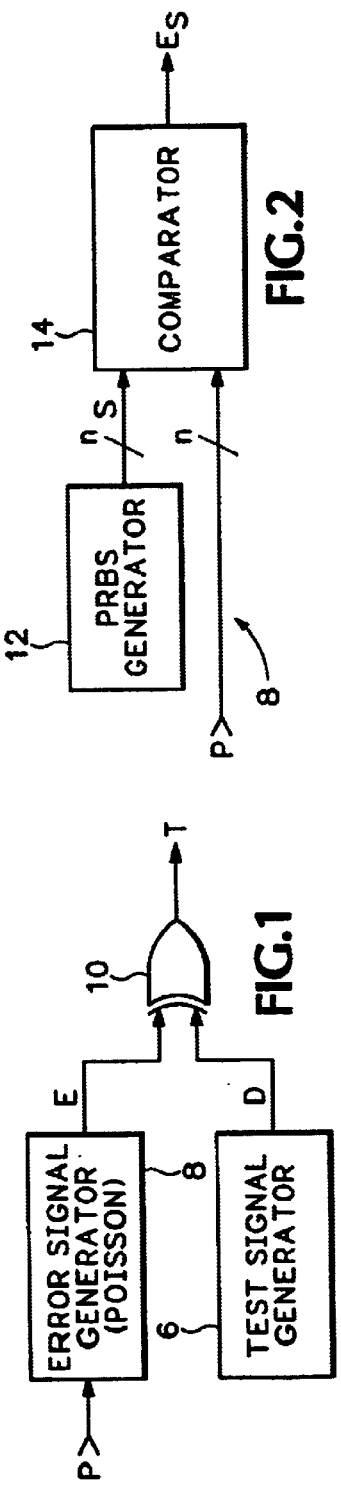
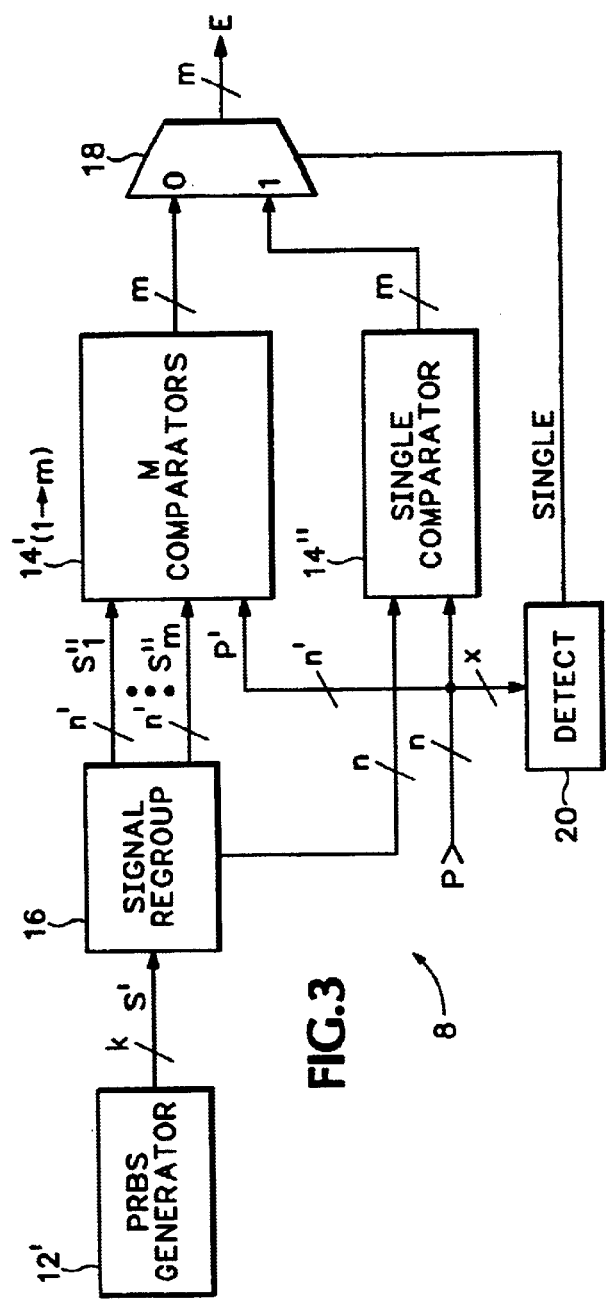

TEST GENERATOR HAVING A POISSON DISTRIBUTION ERROR SIGNAL

BACKGROUND OF THE INVENTION

The present invention relates to the testing of digital communication systems, and more particularly to a test set having a Poisson distribution error signal for generating from a known digital data signal a test signal with a Poisson distribution of errors for use in the testing of digital communication systems.

In the testing of digital communication systems, such as SONET/SDH telecommunication systems, it is desired to stress the systems during testing to determine the boundaries within which the systems will continue to operate effectively. To do this errors are intentionally introduced into a known digital data signal to produce a test signal, and the output of the system in response to the test signal is compared to the known digital data signal to determine what degradation occurs as a result of the introduced errors. In the past errors have been generated on an evenly spaced-in-time basis when producing the test signal. This approach produces errors at a very well specified rate, but the distribution of errors is not a pattern normally found in real world signals. It is possible to get much more randomly distributed errors by attenuating the known digital data signal to produce the test signal, but this is a very approximate approach with no real control over the actual error rate obtained, as well as providing no capability for selectively applying the errors to specific parts of the known digital data signal. In the real world errors come in several distributions, including totally random and bursts of errors. In a totally random, or Poisson, distribution each bit of the digital data signal is errored independently of all other bits. This requires, for a 2.48832 GHz signal generated 32 bits at a time from a 77.76 MHz clock, 32 independent error signals each clock cycle.

What is desired is a test set having a Poisson distribution error signal which generates from a known digital data signal a test signal having a Poisson distribution of errors at a specified rate.

BRIEF SUMMARY OF THE INVENTION

Accordingly the present invention provides a test set for digital communication systems that generates a Poisson distribution error signal to produce from a known digital data signal a test signal having a Poisson distribution of errors. A Poisson error signal generator for the test set has in broadest terms for each bit of an m-bit error signal a pseudo-random binary sequence (PRBS) signal having n bits per clock cycle. Each PRBS signal is compared separately in a corresponding n-bit comparator with a probability control signal reflecting the probability that the bit will be set to a "1" so that for each bit of the m-bit error signal, if the PRBS signal is less than the probability control signal, then that bit of the error signal is set to "1". To simplify the circuitry a single PRBS generator is used having an output number of bits per clock cycle equal to k, where k is greater than n and less than n*m. These bits are distributed so that each of the m comparators receives n bits from the k bits of the PRBS signal for comparison with the control signal. A further simplification reduces the complication of the m comparators by taking into account an error rate where the probability is negligible that multiple bits of the error signal will be set simultaneously, i.e., the probability is that only one of the m bits will be set. Then for probabilities above the "single bit" probability the comparators need only be n'-bit comparators, where n' is less than n, and only the n' most significant bits of the probability control signal are input to the comparators. For the "single bit" case a separate n-bit comparator is used and, when the bit is set, only one of the m bits of the error signal is affected on a random basis. The resulting Poisson distribution error signal from the error signal generator is exclusively OR'd in the test set with the known digital data signal to produce the test signal with a Poisson distribution of errors at a specified rate.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 1 is a simple block diagram view of a test set that produces from a known digital data signal a test signal with a Poisson distribution of errors according to the present invention.

FIG. 2 is a simple block diagram view of a single bit error signal generator for the test set according to the present invention.

FIG. 3 is a simple block diagram view of a multiple bit error signal generator for the test set according to the present invention.

DETAILED DESCRIPTION OF THE INVENTION

Referring now to FIG. 1 a test set is shown having a test signal generator 6 that generates a known digital data signal D and a Poisson distribution error signal generator 8 that generates an error signal E at a specified rate according to a probability control signal P. The known digital data signal D and the error signal E are combined by an exclusive OR gate 10 to produce a test signal T with a Poisson distribution of errors. The error signal E is essentially all zeros with ones being set according to a Poisson distribution at the specified rate as determined by the probability control signal P.

As shown in FIG. 2 a fundamental building block for a single bit error signal $E_s$ generated by the error signal generator 8 is shown. To generate a Poisson distribution of 1's on the error signal $E_s$ that otherwise contains a sequence of all 0's, two circuit elements are used together with the probability control signal P. The probability control signal P determines the probability of any arbitrary bit in the sequence of bits of the single bit error signal $E_s$ being set from a 0 to a 1. This probability is the average 1's density on the error signal $E_s$ which translates directly to an error rate when the error signal is used to inject errors into the known digital data signal D. The first circuit element is a pseudo-random binary sequence (PRBS) generator 12 that provides a sequence S that is "n" bits wide. The PRBS sequence S is generated so that for each clock cycle all n bits are uncorrelated with their contents from the previous clock cycle. The PRBS generator 12 may be implemented as a linear feedback shift register (LFSR) that advances n states each clock cycle, or may be implemented as several independent and uncorrelated LFSRs to provide a total of n bits.

The second circuit element is an n-bit wide comparator (CMP) 14 having a pair of inputs. The sequence S from the PRBS generator 12 is one input to the comparator 14, while the probability control signal P is the other input. The error signal $E_s$ output from the comparator 14 is true, i.e., the bit is set to one, when S is less than P, otherwise it is false, i.e., the bit remains at zero.

A determination of the number of bits n in the PRBS sequence S and in the probability control signal P is made based on a minimum error rate required and a specified accuracy. For example, if the minimum error rate is 1e-12 (1 in 10^12 bits on average having an error) and the specified accuracy is one part in 100, n is chosen so that $2^n$ is at least 1e-14. In this example n has to be at least 47 since $\log_2$(1e-14) is 46.5. The value of the control signal is $2^n$*p where "p" is the probability of setting each individual bit, the same as the average ones density in the error signal $E_s$, and the average error rate on the known digital data signal when combined with the error signal. As an example for n=37 and p=1e-3, the probability control signal P is $2^{37}$*1e-3=137,438,953.

The extension from providing the single bit error signal $E_s$ to providing m multiple simultaneous independent single bit error signals to produce an m-bit error signal E may be done in a trivial manner by simply repeating multiple independent copies of the circuit shown in FIG. 2 m times. Although this approach is workable, it is inefficient due to the replication of both circuit elements 12, 14 m times. The alternative, as shown in FIG. 3, uses a single PRBS generator 12' having an output of k bits, where k is greater than n and less than n*m. For instance for n=48 and m=32, k may be 280. In comparison, for complete replication of the PRBS generator 12 m times there would be (48×32) output bits. The inputs to the m comparators $14'_{(1 \to m)}$ are chosen from various combinations of the 280 bits using an ad hoc selection algorithm defined by a signal regrouping circuit 16 which serves as a giant wire cross connect switch between the PRBS generator 12' and each comparator so each comparator receives a different subset S" of the PRBS sequence S'.

The comparators 14'hd (1→m) may be simplified by analyzing the behavior of the m independent error signals from the m comparators. As the probability of any individual output bit being set increases, the probability of multiple output bits being simultaneously set increases. Conversely as the probability of any individual output bit being set decreases, the probability of multiple output bits being simultaneously set decreases. At some point the probability of multiple output bits being simultaneously set becomes negligible. The probability of m bits of an n-bit word being set with p probability of any individual bit being set is returned by a BINOMDIST (m,n,p,false) function in Microsoft Excel or a comparable program. As an example the probability of 2 bits in 32 being set, using a probability of 7.45e-9 for each single bit being set, is 2.75e-14. At a clock rate of 77.76 MHz this occurs only once every 130 minutes. Thus for error rates less than 7.45e-9 a change mode in the comparators $14'_{(1 \to m)}$ is implemented to disallow multiple bit errors in a single clock time, thus simplifying each comparator. To take advantage of this the number of bits in the PRBS sequence S" at the inputs is reduced enough to n' to support error rates down to the minimum rate where multiple bit errors may occur. Since going to lower error rates requires more bits in the comparators $14'_{(1 \to m)}$, having a higher minimum error rate simplifies the m comparators from n-bit comparators to n'-bit comparators (n'<n). Error rates less than the minimum multiple-bit error rate are handled by a single comparator 14" with enough bits at the input to handle up to the minimum multiple bit error rate. The single comparator 14" generates a single-bit error which is randomly allocated to one of the m bits of the error signal, i.e., only a single bit may be set per clock cycle. The outputs from the m comparators $14'_{(1 \to m)}$ and from the single comparator 14" are input to a selection mechanism 18 which is controlled by a signal SINGLE derived from a detector 20.

SINGLE is indicative of whether the probability control signal P represents a value less than the minimum multiple bit probability value, i.e., the x most significant bits of P are zero. Therefore the detector 20 outputs SINGLE when the x MSBs of P are zero (x<n').

As an example of one implementation the PRBS generator 12' may be implemented as ten independent LFSRs where the combined output is equivalent to a single 237-bit LFSR that produces k=280 bits for S'. The length of each sequence of the LFSRs is chosen to all be prime relative to the lengths of all of the other sequences. Each PRBS variable of the LFSRs is advanced by as many single-bit iterations as there are bits in the variable, giving a totally new uncorrelated set of bits for each variable in one actual system clock time. The output of this PRBS generator 12' is ten separate pseudo-random variables that are effectively treated as a single k-bit variable by the rest of the circuitry, since this is used as a pool of 280 random bits from which to choose m=32 combinations of n'=35 bits, for example, one for each of the 32 separate comparators $14'_{(1 \to m)}$ generating one of the 32 output bits for the error signal E.

The signal regrouping circuit 16 generates the subsets of sequences S". There is no logic done here, as this is just a bunch of wires producing thirty-two different 35-bit groupings from the 280 bits of S' generated by the PRBS generator 12'.

The 32 comparators $14'_{(1 \to m)}$ each compare 35-bit numbers—one is P[47:13] and the other is a different one of the subsets S". If the value of any subset S" is less than the reference value P[47:13], the corresponding one of the m bits is set. The 32-bit output from the comparators $14'_{(1 \to m)}$ represents 32 independent Poisson distribution single-bit error signals.

When the error rate is low enough, the probability of having two bits in 32 set simultaneously is low enough to be ignored. This allows the m comparators $14'_{(1 \to m)}$ to use fewer bits in their comparison since they don't have to go down to very low error rates, as discussed above. For the low error rates only one bit may be set in the 32-bit output, so the single comparator 14" is used for this case. This single comparator 14" looks at more bits—43 in this example, but this additional circuitry occurs only once. A separate collection of PRBS bits, SS[42:0], is used and the comparator output goes true when the upper 22 bits of SS are zero and the lower 21 bits of SS are less than P[20:0]. This single comparator 14" is only used when SINGLE is true, i.e., when the upper bits of P, bits 47:21, are zero. The block diagram implies that the single comparator 14" outputs a 32-bit word. Actually a single bit value is set and the selection mechanism 18 driven by the value of SINGLE selects which bit of the 32 to affect if the result of the comparison is true as determined by specified bits (5 bits where m=32, SS[47:43]) from the output of one of the LFSRs that make up the PRBS generator 12'. If SINGLE is true, which is the case if P[47:21] is zero, then the 32-bit value from the single comparator 14" is output. If SINGLE is false, then the 32 bits from the m comparators $14'_{(1 \to m)}$ are output.

Thus the present invention provides a test set for the generation from a known digital data signal of a test signal having a Poisson distribution of errors by generating a pseudo-random binary sequence for each output bit in an error signal for comparison with a probability control signal so that, if the pseudo-random binary sequence is less than the probability control signal, the particular bit of the error signal is set, the error signal then being combined with the known digital data signal to produce the test signal.

What is claimed is:

1. A test set for generating from a known digital data signal a test signal having a Poisson distribution of errors for use in testing of digital communication systems comprising:

means for generating the known digital data signal;

means for generating a Poisson distribution error signal at a specified rate according to a probability control signal; and means for combining the known digital data signal with the Poisson distribution error signal to produce the test signal.

2. The test set as recited in claim 1 wherein the Poisson distribution error signal generating means comprises:

means for generating a pseudo-random binary sequence; and means for comparing the pseudo-random binary sequence with the probability control signal to set a single bit of the Poisson distribution error signal when the pseudo-random binary sequence is less than the probability control signal.

3. The test set as recited in claim 2 wherein the comparing means comprises means for comparing each of a plurality of independent subsets of the pseudo-random binary sequence with the probability control signal to produce an independent single bit error signal for each bit of the Poisson distribution error signal, the Poisson distribution error signal having a corresponding plurality of bits, each bit being set when the corresponding independent subset is less than the probability control signal.

4. The test set as recited in claim 2 wherein the comparing means comprises:

first means for comparing each of a plurality of independent subsets of the pseudo-random binary sequence with a most significant bit portion of the probability control signal to produce an independent single bit error signal for each bit of the Poisson distribution error signal, the Poisson distribution error signal having a corresponding plurality of bits;

second means for comparing a separate independent subset of the pseudo-random binary sequence with a least significant bit portion of the probability control signal to produce a separate single bit error signal when the separate subset is less than the probability control signal;

means for randomly setting one of the bits of the Poisson distribution error signal as a function of the separate single bit error signal and a sub-subset of the pseudo-random binary sequence; and means for selecting between the Poisson distribution error signal from the first comparing means or from the setting means depending upon the value of the probability control signal with respect to a minimum multiple bit value.

5. The test set as recited in claims 2, 3 or 4 wherein the pseudo-random binary sequence generating means comprises a plurality of independent and uncorrelated linear feedback shift registers, the combined output of which is the pseudo-random binary sequence.

6. The test set as recited in claim 1 wherein the Poisson distribution error signal generating means comprises:

means for generating a plurality of independent pseudo-random binary sequences, the Poisson distribution error signal having a corresponding plurality of bits; and means for comparing each of the plurality of independent pseudo-random binary sequences with the probability control signal to produce an independent single bit error signal for each bit of the Poisson distribution error signal, each bit being set when the corresponding independent pseudo-random binary sequence is less than the probability control signal.

7. A method of generating from a known digital data signal a test signal having a Poisson distribution of errors for use in the testing of digital communication systems comprising the steps of:

generating the known digital data signal;

generating a Poisson distribution error signal at a specified rate according to a probability control signal; and combining the known digital data signal with the Poisson distribution error signal to produce the test signal.

8. The method as recited in claim 7 wherein the Poisson distribution error generating step comprises the steps of:

generating a pseudo-random binary sequence; and comparing the pseudo-random binary sequence with the probability control signal to set a single bit of the Poisson distribution error signal when the pseudo-random binary sequence is less than the probability control signal.

9. The method as recited in claim 8 wherein the comparing step comprises the step of comparing each of a plurality of independent subsets of the pseudo-random binary sequence with the probability control signal to produce an independent single bit error signal for each bit of the Poisson distribution error signal, the Poisson distribution error signal having a corresponding plurality of bits, each bit being set when the corresponding independent subset is less than the probability control signal.

10. The method as recited in claim 8 wherein the comparing step comprises the steps of:

first comparing each of a plurality of independent subsets of the pseudo-random binary sequence with a most significant bit portion of the probability control signal to produce an independent single bit error signal for each bit of the Poisson distribution error signal, the Poisson distribution error signal having a corresponding plurality of bits, each bit being set when the corresponding independent subset is less than the most significant bit portion of the probability control signal;

second comparing a separate independent subset of the pseudo-random binary sequence with a least significant bit portion of the probability control signal to produce a separate single bit error signal when the separate independent subset is less than the least significant bit portion of the probability control signal;

randomly setting one of the bits of the Poisson distribution error signal as a function of the separate single bit error signal and a sub-subset of the pseudo-random binary sequence; and selecting either the Poisson distribution error signal from the first comparing step or from the setting step depending upon the value of the probability control signal with respect to a minimum multiple bit value.

11. The method as recited in claims 8, 9 or 10 wherein the pseudo-random binary sequence is produced by the combined output of a plurality of independent and uncorrelated linear feedback shift registers.

12. The method as recited in claim 7 wherein the Poisson distribution error generating step comprises the steps of:

generating a plurality of independent pseudo-random binary sequences, the Poisson distribution error signal having a corresponding plurality of bits; and comparing each of the independent pseudo-random binary sequences with the probability control signal to produce an independent single bit error signal for each bit of the Poisson distribution error signal, each bit being set when the corresponding independent pseudo-random binary sequence is less than the probability control signal.

13. A Poisson distribution error signal generator comprising:

means for generating a pseudo-random binary sequence; and means for comparing the pseudo-random binary sequence with a probability control signal to set a single bit of the Poisson distribution error signal when the pseudo-random binary sequence is less than the probability control signal.

14. The Poisson distribution error signal generator as recited in claim 13 wherein the comparing means comprises means for comparing each of a plurality of independent subsets of the pseudo-random binary sequence with the probability control signal, the Poisson distribution error signal having a corresponding plurality of bits, to produce a single bit error signal for each bit of the Poisson distribution error signal, each bit being set when the corresponding independent subset is less than the probability control signal.

15. The Poisson distribution error signal generator as recited in claim 13 wherein the comparing means comprises:

first means for comparing each of a plurality of independent subsets of the pseudo-random binary sequence with a most significant bit portion of the probability control signal, the Poisson distribution error signal having a corresponding plurality of bits, to produce a single bit error signal for each bit of the Poisson distribution signal, each bit being set when the corresponding independent subset is less than the most significant bit portion of the probability control signal;

second means for comparing a separate independent subset of the pseudo-random binary sequence with a least significant bit portion of the probability control signal to produce a separate single bit error signal when the separate independent subset is less than the least significant bit portion of the probability control signal;

means for randomly setting one of the bits of the Poisson distribution error signal as a function of the separate single bit error signal and a sub-subset of the pseudo-random binary sequence to produce the Poisson distribution error signal; and means for selecting between the Poisson distribution error signal from the first comparing means or from the setting means depending upon the value of the probability control signal relative to a minimum probability error value.

16. The Poisson distribution error signal generator as recited in claims 13, 14 or 15 wherein the generating means comprises a plurality of independent and uncorrelated linear feedback shift registers, the combined output of which is the pseudo-random binary sequence.

17. A Poisson distribution error signal generator comprising:

means for generating a plurality of pseudo-random binary sequences, the Poisson distribution error signal having a corresponding plurality of bits; and means for comparing each pseudo-random binary sequence with a probability control signal to produce a single bit error signal for each bit of the Poisson distribution error signal, each bit being set when the corresponding pseudo-random binary sequence is less than the probability control signal.

18. A method of generating a Poisson distribution error signal comprising the steps of:

generating a pseudo-random binary sequence; and comparing the pseudo-random binary sequence with a probability control signal to set a single bit of the Poisson distribution error signal when the pseudo-random binary sequence is less than the probability control signal.

19. The method as recited in claim 18 wherein the comparing step comprises the step of comparing each of a plurality of independent subsets of the pseudo-random binary sequence with the probability control signal, the Poisson distribution error signal having a corresponding plurality of bits, to produce the Poisson distribution error signal, each bit being set when the corresponding independent subset is less than the probability control signal.

20. The method as recited in claim 18 wherein the comparing step comprises the steps of:

first comparing each of a plurality of independent subsets of the pseudo-random binary sequence with a most significant bit portion of the probability control signal, the Poisson distribution error signal having a corresponding plurality of bits, to produce the Poisson distribution error signal, each bit being set when the corresponding independent subset is less than the most significant bit portion of the probability control signal;

second comparing a separate independent subset of the pseudo-random binary sequence with the probability control signal to generate a separate single bit error signal for the Poisson distribution error signal when the separate independent subset is less than the probability control signal;

randomly setting one of the bits of the Poisson distribution error signal as a function of the separate single bit error signal and a sub-subset of the pseudo-random binary sequence; and selecting between the Poisson distribution error signal from the first comparing step or the Poisson distribution error signal from the setting step depending upon the relationship of the probability control signal to a minimum multiple bit value.

21. The method as recited in claims 18, 19 or 20 wherein the pseudo-random binary sequence is generated by a plurality of independent and uncorrelated linear feedback shift registers.

22. A method of generating a Poisson distribution error signal comprising the steps of:

generating a plurality of pseudo-random binary sequences, the Poisson distribution error signal having a corresponding plurality of bits; and comparing each pseudo-random binary sequence independently with a probability control signal to produce an independent signal bit error signal for each bit of the Poisson distribution control signal, each bit being set when the corresponding pseudo-random binary sequence is less than the probability control signal.

* * * * *